United States Patent [19]

Hutson

[11] 4,060,824

[45] Nov. 29, 1977

[54] SLOW SPEED SEMICONDUCTOR SWITCHING DEVICE

[76] Inventor: Jearld L. Hutson, P.O. Box 34235, Dallas, Tex. 75234

[21] Appl. No.: 587,536

[22] Filed: June 16, 1975

Related U.S. Application Data

[63] Continuation-in-part of Ser. No. 488,789, July 15, 1974, abandoned.

[51] Int. Cl.² ............................................. H01L 29/00
[52] U.S. Cl. .................................. 357/37; 307/252 A; 357/38; 357/57
[58] Field of Search .................... 357/37, 38, 39, 57; 307/252 A

[56] References Cited

U.S. PATENT DOCUMENTS

| 2,838,617 | 6/1958 | Tummers et al. | 357/37 |
| 2,980,810 | 4/1961 | Goldey | 357/39 |
| 3,165,710 | 1/1965 | Strull | 357/57 |
| 3,251,004 | 5/1966 | Shombert et al. | 357/39 |
| 3,274,463 | 9/1966 | Hutson | 357/39 |
| 3,391,310 | 7/1968 | Gentry | 357/39 |
| 3,864,719 | 2/1975 | Uematsu et al. | 357/57 |

FOREIGN PATENT DOCUMENTS

| 459,371 | 9/1968 | Switzerland | 357/39 |

OTHER PUBLICATIONS

I. Grekhov et al., "Thyristors with more than one Collector," Physics of P-N Jcns. and Semiconductor Devices, 2nd Ed., London, England, 1971, pp. 224-227.

A. Lebedev, "Analysis of Processes in Multilayer Semiconductor Structures of the N-P-N-P-N-P Type," Physics of P-N Jcns. and Semiconductor Devices, 2nd Ed., London, England, 1971, pp. 321-329.

Primary Examiner—Stanley D. Miller, Jr.
Assistant Examiner—Joseph E. Clawson, Jr.
Attorney, Agent, or Firm—Richards, Harris & Medlock

[57] ABSTRACT

The specification discloses a slow speed semiconductor switching device including a body of semiconductor material having at least six layers of alternating opposite types of conductivity to form a plurality of P-N junctions. Anode and cathode electrodes are attached to exterior ones of the layers having opposite conductivity types. A gate electrode is connected to one of the layers for receiving a gating signal. The gating signal is of a predetermined level to cause more than one regenerative switching action within the body. In operation of the device, the total switching action of the body is sufficiently slow to substantially inhibit the generation of rf current by the body.

5 Claims, 5 Drawing Figures

SLOW SPEED SEMICONDUCTOR SWITCHING DEVICE

RELATED APPLICATIONS

This application is a continuation-in-part of copending patent application Ser. No. 488,789, filed July 15, 1974, now abandoned and entitled "MULTILAYER SEMICONDUCTOR SWITCHING DEVICES", by the present applicant.

FIELD OF THE INVENTION

This invention relates to semiconductor devices, and more particularly relates to a semiconductor switch having relatively slow switching operation.

THE PRIOR ART

In many operations, it is desirable to provide a semiconductor switch which may be switched on by a gating signal and which does not generate substantial rf current. For example, in a light dimmer circuit, it is desirable to provide a switch with a relatively slow switching time in order to substantially reduce the amount of rf current generated. It has thus been heretofore known to utilize a laterally elongated semiconductor body wherein a switching signal initiates a switching action which propogates laterally along the device, thereby increasing the switching time of the device. These prior switches are relatively expensive and create a substantial amount of heat, due to the large surface area required for the device. In addition, some prior devices generate audible noise during switching operations. A need has thus arisen for a semiconductor switch which provides relatively slow switching action to inhibit the action of rf current, but which is relatively inexpensive and which reduces heat generation.

SUMMARY OF THE INVENTION

In accordance with the present invention, a semiconductor switch is provided with a relatively slow switching speed to substantially inhibit the generation of rf current with the use of a plurality of regenerative actions occuring substantially perpendicularly to the P-N junctions of the device.

In accordance with a more specific aspect of the invention, a slow speed semiconductor switching device includes a body of semiconductor material having a plurality of layers of alternating opposite conductivity types to form a plurality of internal P-N junctions. Electrodes are connected to the body for receiving electrical bias and electrical gating signals for causing switching of the body. The body includes sufficient layers of alternating opposite conductivity types to have more than one regenerative switching action upon receipt of a gating signal. The switching action is sufficiently slow to inhibit the generation of excessive rf current.

In accordance with another aspect of the invention, a slow speed semiconductor switching device includes a body of semiconductor material having at least six layers of alternating opposite types of conductivity to form a plurality of P-N junctions. First and second electrodes are attached to exterior ones of layers having opposite conductivity types. A gate electrode is connected to one of the layers for receiving a gating signal, the gating signal being of a predetermined level to cause more than one regenerative switching action within the body. The total switching action of the body is sufficiently slow to substantially inhibit the generation of excessive rf current by the body.

In accordance with yet another aspect of the invention, a slow speed semiconductor switch includes a central layer of first conductivity type. At least three layers of alternating second and first conductivity types are formed on both sides of the central layer to form at least six internal P-N junctions. A first electrode contacts an exterior layer of the second conductivity type. A layer of the first conductivity type and a layer of the second conductivity type extend to a common exterior surface. Second and third electrodes contact the layers extending to the common exterior surface to form a three terminal switch having at least two regenerative switching actions occuring normally to the P-N junctions at a rate to inhibit the generation of excessive rf current.

DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENT

Figure 1:
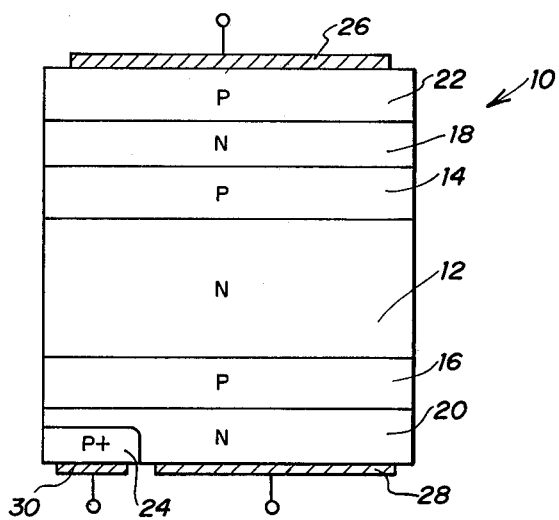
FIG. 1 is a sectional view of a device formed in accordance with the present invention.

FIG. 1 illustrates a sectional view of one embodiment of the present invention, wherein a semiconductor body 10 includes a center layer 12 of N-type material. P-type layers 14 and 16 are formed on opposite sides of layer 12. N-type layers 18 and 20 are formed on adjacent layers 14 and 16, respectively. A P-type layer 22 is formed adjacent layer 18 to form an exterior surface of the body 10. A P+ region or layer 24 is formed in layer 20 in the manner illustrated. An electrode 26 contacts the exterior layer of P-type layer 22. A second electrode 28 contacts the exterior surface of the N-type layer 20. An electrode 30 contacts the P+ region 24. The device formed in accordance with FIG. 1 thus comrpises essentially a seven layer device.

The device of FIG. 1 comprises a three terminal asymmetrical regenerative semiconductor switch which operates essentially in the manner of a three terminal SCR-type device. The electrode 26 operates as the device anode, electrode 28 as the device cathode and electrode 30 as the device gate. In operation of the device, the P+ region 24 injects carriers into layers 16 and 20, thereby causing a first regenerative action. Subsequently, a second regenerative action occurs in order to place the device fully in conduction. The device in operation thus acts in a similar manner as two interconnected four-layer N-P-N-P devices.

For a more detailed description of the construction and operation of the device shown in FIG. 1, reference is made to the disclosure of the copending patent application Ser. No. 488,789, filed July 15, 1974 and entitled "MULTILAYER SEMICONDUCTOR SWITCHING DEVICES", by the present applicant.

The device shown in FIG. 1 may be formed in any suitable manner according to techniques well known in the art. For example, a N-type electrical conductivity silicon wafer may be diffused on both sides in various steps to form the layers 12-22. The P+ region 24 may then be formed in layer 20 by conventional diffusion techniques using suitable dopants or impurities which are compatible with the particular semiconductor material being operated upon. The particular size and shapes of the diffused regions are of course determined by suitable masking and photographic techniques conventionally employed in semiconductor diffusion technology. It will be understood that any suitable semiconductor material may be utilized to form devices according to the invention, but for clarity of illustration, reference is made in the drawings to particular electrical conductivity types and to silicon as the material being utilized. It will, of course, be understood that the electrical conductivity types herein specified may be interchanged and reversed.

As previously noted, more than one regenerative action occurs in the device shown in FIG. 1 during switching operation. These regenerative actions occur generally normally to the P-N junctions formed by the layers of the body. Consequently, the majority of the carrier flow in the device is perpendicular to the P-N junctions, and lateral flow carriers is not substantial.

Figure 2:
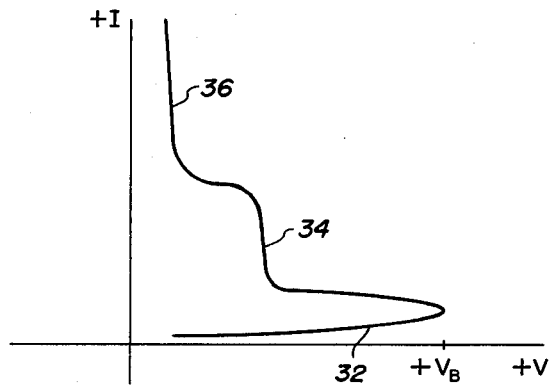
FIG. 2 is a diagram of the current-voltage characteristic waveform of a device constructed in accordance with FIG. 1.

The occurrence of more than one regenerative action during switching of the device enables the device shown in FIG. 1 to operate as a slow switching device. The I-V diagram of FIG. 2 indicates the regenerative switching action of the present device, wherein $V_B$ indicates the breakover voltage. When suitable positive bias voltage is applied across the cathode and anode of the device of FIG. 1, with a zero gate bias being applied, a very slow increase in output current is provided as indicated by the curve portion 32. When the applied voltage reaches the breakover voltage $V_B$, the device becomes conductive and the output current increases sharply due to the first regenerative action as indicated by the curve portion 34. The second regenerative action then occurs and the output current increases sharply as indicated by curve portion 36.

It will be understood that the dimensions of the device shown in FIG. 1 will be determined in accordance with the desired operating characteristics. Generally, the thickness of the body shown in FIG. 1 will be greater than 8 mils to 10 mils. With such thickness, the device shown in FIG. 1 is operable to provide much slower switching speeds than conventional SCR devices.

Figure 3:
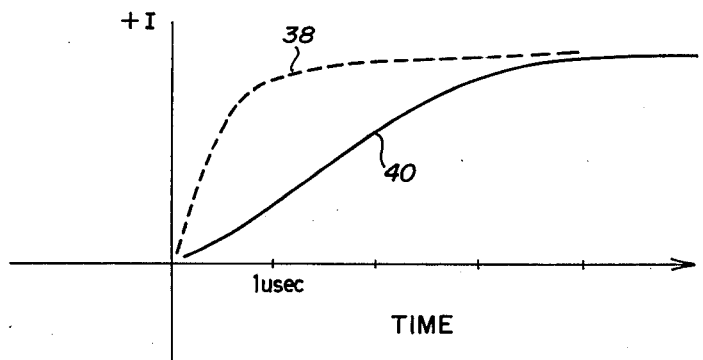
FIG. 3 is a somewhat diagrammatic illustration of the rise time of the device shown in FIG. 1.

Referring to FIG. 3, the dotted line 38 indicates the rise time characteristics of a typical SCR device. As indicated, such a fast rise time creates the generation of undesirable rf current. With use of the present invention shown in FIG. 1, a much slower rise time such as indicated by curve 40 may be provided. With conventional switching devices, rise times of 1 microsecond are common. With the use of the present device, with a device thickness in the range of 15 mils, a rise time of 2 microseconds to 4 microseconds may be provided. Due to the construction of the embodiment shown in FIG. 1, a large amount of semiconductor material such as required in the prior art is not necessary, thereby reducing fabrication costs and heat generation.

It will be understood that the rise time provided for operation of the present device is to a degree determined by the magnitude of gating current applied thereto. Another advantage of the present invention is that if a very fast terminal time is required, the device may be switched much faster by the provision of a high switching current.

While FIG. 1 illustrates a seven layer device, the present invention may comprise a six layer device. In the six layer embodiment, the region 24 is eliminated, and a gate electrode is attached to layer 16. Gating signals are then applied through the gate electrode to layer 16 to cause multiple regenerative actions in accordance with the invention.

Figure 4:
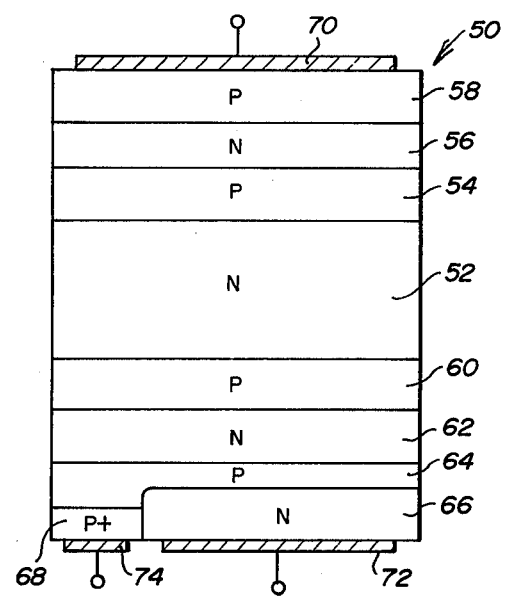
FIG. 4 is sectional view of another emobodiment of the present invention.

FIG. 4 illustrates a second embodiment of the invention wherein additional semiconductor layers are provided to provide additional regenerative actions to further slow the switching time of the device. Referring to FIG. 4, a device 50 includes a central N-type layer 52. Layers 54, 56 and 58 provide a P-N-P layer arrangement formed on one side of the layer 52. Layers 60, 62 and 64 provide a second P-N-P arrangement formed on the opposite side of the N-type layer 52. A N-type layer 66 is formed adjacent layer 64, and a P+ layer 68 is formed in the manner shown. An anode electrode 70 is formed on the exterior surface of layer 58. A cathode electrode 72 is formed in contact with layer 66. A gate electrode 74 is formed in contact with the P+ region 68. The device shown in FIG. 4 thus comprises an eight layer device which operates to provide three regenerative switching actions.

Figure 5:
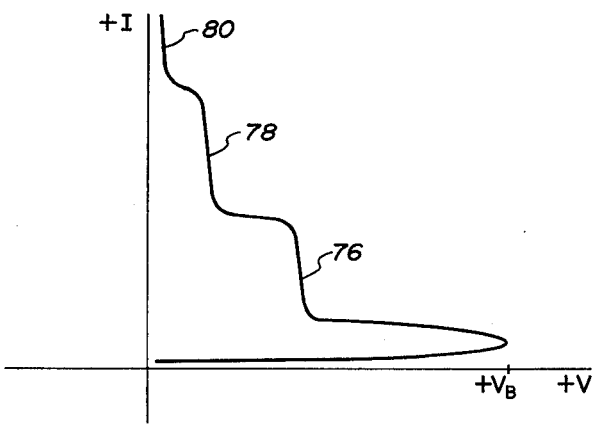
FIG. 5 is a somewhat diagrammatic representation of the current-voltage characteristics of the device shown in FIG. 4.

It will be understood that the addition of more layers to the device shown in FIG. 4 will provide additional regenerative actions and will further delay the switching action. The I-V diagram of the device is illustrated in FIG. 5 and illustrates the occurrence of three regenerative switching actions by curve portions 76, 78 and 80. The device shown in FIG. 4 thus provides an even slower switching rise time than the device shown in FIG. 1, and may advantageously be utilized when it is desired to inhibit the generation of rf current.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A slow speed asymmetrical semiconductor switching device comprising:
   a body of semiconductor material having at least six layers of alternating opposite types of conductivity to form a plurality of P-N junctions,
   first and second electrodes attached to exterior ones of said layers having opposite conductivity types,
   a gate electrode connected to one of said layers for receiving a gating signal having either of two levels, one of the levels of said gating signal being of a predetermined low value to cause more than one regenerative switching action within said body during switching of the device from a nonconductive state to a conductive state, said regenerative switching actions occurring primarily perpendicularly to said P-N junctions and the total switching time of said body being greater than one microsecond to inhibit the generation of rf current by said device, and the second of the levels of said gating signal being of a predetermined high value to cause said device to switch from a nonconductive state to a conductive state within an interval on the order of one microsecond.

2. The slow speed switching device of claim 1 wherein said body has eight layers of alternating opposite conductivity types to form seven internal P-N junctions and wherein said gating signal having said predetermined low value causes at least three regenerative actions.

3. The slow speed switching device of claim 1 wherein one of said layers includes a P+ region connected to said gate electrode.

4. The slow speed switching device of claim 1 wherein said body has seven layers of alternating opposite conductivity types to form six internal P-N junctions and wherein a layer of opposite conductivity types each extend to a common exterior surface for connection to one of said first and second electrodes and said gate electrode.

5. The slow speed switching device of claim 1 wherein said total switching action occurs during a period of at least 2 microseconds.

* * * * *

UNITED STATES PATENT AND TRADEMARK OFFICE
CERTIFICATE OF CORRECTION

PATENT NO. : 4,060,824
DATED : November 29, 1977
INVENTOR(S) : Jearld L. Hutson

It is certified that error appears in the above–identified patent and that said Letters Patent are hereby corrected as shown below:

Column 2, line 32, change "emobodiment" to --embodiment--
Column 3, line 30, after "flow" insert --of--

Signed and Sealed this

Twentieth Day of June 1978

[SEAL]

Attest:

RUTH C. MASON
Attesting Officer

DONALD W. BANNER
Commissioner of Patents and Trademarks